US006728382B1

(12) United States Patent
Silfvast

(10) Patent No.: US 6,728,382 B1
(45) Date of Patent: Apr. 27, 2004

(54) FUNCTIONAL PANEL FOR AUDIO MIXER

(75) Inventor: Scott W. Silfvast, Woodside, CA (US)

(73) Assignee: Euphonix, Inc., Palo Alto, CA (US)

( * ) Notice: Subject to any disclaimer, the term of this patent is extended or adjusted under 35 U.S.C. 154(b) by 0 days.

(21) Appl. No.: 09/371,908

(22) Filed: Aug. 10, 1999

Related U.S. Application Data

(63) Continuation-in-part of application No. 09/027,581, filed on Feb. 23, 1998.

(51) Int. Cl.[7] ............................ H04B 1/00; H03G 3/00; G06F 17/00; G10H 7/00

(52) U.S. Cl. ........................... 381/119; 381/61; 700/94; 84/625; 84/600

(58) Field of Search ..................... 381/119, 61; 700/94; 84/625, 660

(56) References Cited

U.S. PATENT DOCUMENTS 3,916,317 A 10/1975 Gibson et al.
4,879,751 A * 11/1989 Franks et al. ............... 381/109
5,212,733 A * 5/1993 DeVitt et al. ............... 345/727
5,257,317 A 10/1993 Stavrou
5,450,075 A 9/1995 Waddington
5,608,807 A * 3/1997 Brunelle ..................... 381/118
5,812,688 A * 9/1998 Gibson ....................... 345/978
5,959,610 A * 9/1999 Silfvast ...................... 345/156
6,061,458 A * 5/2000 East et al. .................. 381/119
6,118,283 A 9/2000 Cripe
6,438,241 B1 * 8/2002 Silfvast et al. .............. 307/112

* cited by examiner

*Primary Examiner*—Forester W. Isen
*Assistant Examiner*—Laura A. Grier
(74) *Attorney, Agent, or Firm*—Wilson Sonsini Goodrich & Rosati

(57) ABSTRACT

A control device for an audio processor has a plurality of sets of function select controls and a function control section on its control device. Each set of the plurality of sets of function select controls is coupled with a corresponding channel in a plurality of channels associated with the audio processor. The sets include select switches for a predetermined set of functions which are executable in the corresponding channels. The select switches have first and second states which are visually distinguishable by an operator. The plurality of sets of function select controls are arranged on the control panel in a row, and the select switches in the plurality of sets are arranged in respective single columns within the plurality of sets so that the select switches for a particular function across the plurality of channels form a single band on the control panel. The sets of function select controls may also include in/out switches coupled with corresponding functions in the plurality of predetermined functions. These in/out switches are arranged within the sets in a single column parallel with the single column of select switches so that the in/out switches corresponding to a particular function lie visually in the band of select switches for the particular function. The function control section includes controls for setting parameters for a selected function in a selected channel.

12 Claims, 8 Drawing Sheets

FUNCTIONAL PANEL FOR AUDIO MIXER

CROSS REFERENCE TO RELATED APPLICATION

The present application is a continuation-in-part of co-pending U.S. patent application entitled MULTIPLE DRIVER ROTARY CONTROL FOR AUDIO PROCESSORS OR OTHER USES, application Ser. No. 09/027,581, filed on Feb. 23, 1998, invented by Scott Silfvast, which is incorporated by reference as if fully set forth herein.

BACKGROUND OF THE INVENTION

1. Field of the Invention

The invention relates to the field of functional display consoles such as those used in audio mixing consoles. More particularly, this invention relates to a functional design of the channels of an audio mixing console that maximizes the operator's perceptual capabilities of pattern recognition and peripheral vision.

2. Description of Related Art

Audio mixing consoles are used in the music industry and other industries to produce professional quality audio products. For example, studios used by artists, producers or engineers use mixing consoles to produce music for live performances, compact discs, television or films on a project by project basis.

In a typical mixing production, several inputs are coupled to the mixing console with a separate audio channel provided for each input. Depending on the type of production, these inputs might consist of prerecorded tracks of individual instruments or voices, or might be a combination of several instruments and voices. Each channel includes a number of functions such as equalizer functions, dynamics processors, fader processes, and the like. Using the audio mixing console, an operator is able to manage the characteristics of the functions being used in a particular channel to alter the audio characteristics of the input provided to that channel. The processed signals that emerge from each of the channels can then typically be combined together, or mixed, to produce a final mixed audio product.

Traditionally, mixing consoles have utilized analog style controls to monitor and effect changes to the signals resident in the mixing console channels. As mixing productions have become more complex a need for more flexible and automated mixing consoles has rapidly developed. Although analog consoles have introduced various features such as motorized automated faders in order to meet this growing demand, the capability of the traditional analog mixing console is being stretched to its limit.

The ability of the operator of a mixing console to properly operate a console is directly limited by its size. Simply stated, even the most accomplished operator can not feasibly operate an analog system once it grows beyond some critical dimension because the operator cannot reach the controls. Thus, the number of parameters under control is limited by physical size in the prior art. On the other hand, digital control mixing consoles have the ability to add the complex functionality and automation needed by today's professional sound mixes without adding significantly to the overall size of the mixing console. This is because by using digital circuitry, switches and functions that were once dedicated to performing a single task on an analog console can more easily be given numerous assignable functions and controls. Digital control consoles offer the added advantage of easier and more complete automation, as digitally assignable components may be directly controlled by a computer at the request of the operator. Using digital consoles also improves the performance of the console with respect to heat generation, serviceability, portability and power consumption.

Since modern digital mixing consoles can apply computer power and software flexibility to enhance, automate and streamline the mixing process that has traditionally relied largely upon manual control, one would assume that the industry would move quickly to the use of digital over analog. However, a large percentage of the professional audio mixing industry continues to use analog mixing consoles. Some of the reasons are purely economic. One of the major reasons however, is the fact that a lot of the operators in the industry find the typical digital console too complex and non-user friendly. This is especially true in those sectors of the industry involved with processing live broadcast audio where a mistake caused by an operator's unfamiliarity with the controls is irreversible and broadcast to millions of listeners. Therefore, a large group of professional sound engineers would rather forego the advances in capability and performance offered by digital systems in order to continue using an analog system with familiar but inferior controls.

FIGS. 1 and 2 are heuristics that illustrate a simplified example of a major problem that digital consoles with multi-function channel capability have created for operators. FIG. 1 is a simplified top view of the layout of a portion of a prior art digital audio mixing console with a plurality of channels. As can be seen in FIG. 1, the console includes a control device 100. The control device 100 generally includes a central operations area 110, that may include a variety of controls and indicators for overall management of the console. The control device 100 further includes a plurality of channel strips 140 on either side of the central operations area 110 as represented by first channel strip region 120 and second channel strip region 130. Each channel strip 140 consists of a channel control module 150 that is used to control the audio processes that are applied to the audio inputs to the channel strip 140. Each channel control module 150 includes a set or sets of function controls 152, a clustered set of function choice switches 156, and a fader 160.

FIG. 2 is a more detailed top view of four of the channel strips 140. FIG. 2 also includes an illustration of some of the audio processing functions that a typical console would include in its set of function choice switches 156. These functions, which will be discussed in more detail later, include: Equalization (EQ), Dynamics (Dyn), Auxiliary Send (Aux), Operator Programmable Function (*), Channel (CH), and Pan.

When an operator of the console of FIG. 1 desires to control a particular function in a channel strip 140 he selects the function by operating the appropriate function choice switch 158 in the set of function choice switches 156 in the channel control module 150 associated with the identified channel strip 140. Assuming that the function is allocated, then the indicator for the operated function choice switch 158 will give visual feedback, such as a light, to indicate to the operator that it has been selected. After making the selection the operator can adjust the parameters associated with that function by operating the function controls 154 in the set or sets of function controls 152 in the channel control module 150. In this manner the operator can select whatever function he wishes to currently control in any given channel assuming that the function has been allocated resources.

It is important that the engineer be able to quickly identify what functions are being controlled on each one of his channels. A console that allows an engineer the luxury of scanning his console to identify currently controlled functions frees up the engineer's time to perform the mix without worrying about the complexity of his controls and without having to leave his seat to interrogate the status of channels he is unsure of As illustrated in FIG. 1 with reference to FIG. 2, typical prior art digital consoles have failed in providing this benefit to operators. First function control grouping 170 represents a grouping of channels on which the operator has decided that "EQ" will be the function controlled the majority of the time. Similarly, second function control grouping 172 represents a "Pan" grouping, third function control grouping 174 represents an "*" grouping, and fourth function control grouping 176 represents a "Dyn" grouping. These settings are simplified for the purpose of this example.

Referencing the layout of the function choice switches 158 in the set of function choice switches 156 shown in FIG. 2, when EQ is selected in a channel the top middle indicator in the set of function choice switches 156 will give visual feedback such as an energized light. Thus, for each of the aforementioned groupings one through four, the appropriate light will be on. These energized lights are illustrated in FIG. 1 for the grouping described above. Note that in the first and second channels Pan is lit instead of EQ, and in the last and next to last channels * is lit instead of Dyn. This is to illustrate the indicators that will be visible to an operator when he is currently using a function other than the group function in a channel within the group. Note that the typical prior art cluster design of the set of function choice switches 156 makes it very difficult for an operator sitting at the center of the console to see what functions are being controlled with just his peripheral vision, and therefore to take quick note of what group channels are currently not controlling the group function. With the indicators for EQ and Pan, and * and Dyn being adjacent as here, the difference in indication between an EQ light and a Pan light in the first channel, and * and Dyn light in the last channel, becomes nearly imperceptible, and would force an operator to get up and interrogate the channel.

The situation becomes markedly worse than in this simplified example as each channel would be controlling a function chosen with no particular setup in mind. Combining this random setup with the typical cluster design of FIGS. 1 and 2 would lead to a random dispersion of indicator lights across the console which would convey little, if any, quick scan information to the operator. Again, the operator would have to individually interrogate channels for information.

From the above discussion, it is clear that "clustering" of the function choice switches 158 does not provide the operator with quick scan information that is accurate enough to be relied upon. Thus if the operator needed to know what function was being controlled in the channel farthest to his left on the console he would have to get up to interrogate the channel.

Another prior art approach is to use color coding of the function choice switches 158 to distinguish between the available functions. This method has also proven to be an unacceptable solution to the problem. Some sound engineers are color blind. Further, it is known that color blindness affects the ability to distinguish between the colors red, green and yellow to a higher degree than most other colors. Given that the cheapest and most common LED's used in the production of mixing consoles are red, green and yellow, it is clear that using a color code technique would not solve the present problem adequately. Thus, it remains a problem that in digital consoles with channels having multiple assignable functions the operator must interrogate each channel in order to discover what function is currently being controlled on that channel.

These illustrations are for demonstration purposes only, and should not be construed as representative of the full extent of the above problem. An actual console may have as many as two hundred or more channels for the operator to contend with which greatly exacerbates the problem of identifying active channel functions. Also not shown on FIGS. 1 and 2 are the hundreds of other indicator lights that may be present on a typical console that add still further to the difficulties an operator has when trying to identify what functions are being controlled in the channels. Thus, although FIGS. 1 and 2 illustrate the basic problem, one must take into consideration the context of an actual audio production to appreciate its full extent.

Another problem created by the use of digital consoles with channels having multiple assignable functions is related to the hardware limitations of the processing equipment coupled to the mixing console. For, even though the typical digital console has the capability to assign any one of a given number of functions in a channel to the function controllers in the channel, the overall system might be limited in the total number of functions that can be actually applied to the inputs at any one time. For instance, if one were operating a system with 48 channels on the console, but the console was coupled to hardware that was only capable of handling 24 EQ processes, then only 24 of the 48 channels could be actively assigned the EQ function. If the operator tried to select EQ on a channel to which the processor had not allocated EQ then the signal would not be EQ processed.

With this in mind it appears that it would be useful for the operator to be able to glance at his panel to determine which of the multiple functions in each of the channels has been allocated processing resources. The solution to this problem that has been applied by the typical digital console has been inadequate. For instance, in order to determine whether a particular function in a channel has been allocated using the console illustrated in FIGS. 1 and 2, the operator would have to select each function individually by operating its respective function choice switch 158. Upon selection of the function, the "ON" function choice switch 158 would indicate whether or not the particular function was in or out of circuit. If the function was out of circuit the operator could place it in circuit by operating the "ON" function choice switch 158. If, after trying to place the function in circuit, the "ON" indicator still showed the function as being out of circuit then the operator would know that the function had no resources allocated in that channel. This multistep procedure to determine whether a single function was allocated in a channel is extremely inefficient. Further, when one considers the effect over a multitude of channels, often as large as two hundred, each with multiple functions, the negative effect on an operator's efficiency becomes evident.

It is clear that another solution would be to couple the mixing console to an audio processor that was powerful enough to be able to allocate resources to all of the functions in all of the channels. This solution is impractical and economically infeasible. For, in the vast majority of sound mixing productions only a fraction of the available functions are required per channel to perform the required mix. It would thus be a waste of resources to invest in the equipment necessary to allocate every function to every channel. Given a set amount of hardware capability it is more efficient economically to be able to allocate the given resources to only the functions that are needed. Therefore since all of the functions are not available on all of the channels in an economically optimized console, it becomes necessary for the operator to know which functions are available on a given channel.

The operator of a traditional analog system with only one processing function acting upon a channel has the ability to quickly take that function in or out of the circuit. This is important to the operator because it is a task that he performs regularly during a mix. By taking the function out of circuit the operator can listen to the input to the channel without the processing of the function and then place it back in circuit to aurally analyze the effect the function is having on the audio input. The current digital systems do not allow the operator to perform this common task as quickly on each of the multiple functions being applied to a given channel. For instance, assume an operator wanted to perform this task on the EQ function on one of the four channel strips 140 of FIG. 2. The first problem encountered would be that the operator would not be able to tell at a glance whether EQ was even currently allocated to the channel as described above. The operator would have to select the functions on the set of function choice switches 156 until the EQ function was brought up and then he would have to take EQ out of circuit. Although this does not sound as if it represents a major time loss for the operator, when placed in context it is a significant problem. Operator's will commonly perform this in and out task on every channel of a single function. To perform the equivalent task, an operator of the typical digital console of FIG. 1 would have to perform the two step paging procedure described above on every channel of his console. For, unless the operator knew with certainty which channels had EQ processing allocated, he would have to check each channel since the information is not readily available without paging.

In view of the foregoing, there is the need for a digital based mixing console that incorporates all of the substantial advantages that digital consoles have over analog consoles while simultaneously overcoming the problems of complexity and difficulty of use as described above.

SUMMARY OF THE INVENTION

It is therefore an object of the present invention to overcome these and other drawbacks of the prior art. A main objective of the present invention is to make digital audio mixing consoles more user friendly such that sound engineers will transition from using traditional analog audio mixing consoles to using technically superior digital consoles.

Specifically, it is an object of the invention to enable a sound engineer to quickly scan, rather than interrogate, an audio mixing console to determine which function is currently being controlled on each of the console's channels.

It is a further object of the invention to make it easier for a sound engineer to quickly scan, rather than interrogate, an audio mixing console to determine which functions are available to be controlled, and which are not, on each of the console's channels.

Yet another object of the invention is to enable a sound engineer to quickly scan an audio mixing console to determine which functions are currently being applied to the signals in each of the console's channels.

A still further object of the invention is to enable a sound engineer to toggle any function in any channel of an audio mixing console in and out of circuit in a single step.

These and other needs are met in one embodiment of the invention consisting of a control device for an audio processor having a plurality of channels and a plurality of functions in the channels. The control device has a plurality of sets of function select controls and at least one function control section on its control device. The plurality of sets of function select controls are arranged on the control panel in a row, and the select switches in the plurality of sets are arranged in respective single columns within the plurality of sets so that the select switches for a particular function in the plurality of functions form a single band across the plurality of channels on the control panel to enable the operator to identify the states of select switches for a particular function in the plurality of functions by looking along a band of select switches on the control panel.

Each set of the plurality of sets of function select controls on the control panel is coupled with a corresponding channel in the plurality of channels. The sets include respective columns of select switches for a predetermined set of functions which are executable in the corresponding channels. The select switches have first and second states which are visually distinguishable by an operator as the select switches are comprised of elements having first and second visually distinguishable modes. The function control section includes controls for setting parameters for a selected function in a selected channel.

The sets of function select controls are coupled with the function control section by logic which, in response to the state of the select switch for a selected function, enables the audio processor to apply the selected function to the controls in the function control section. This enables the operator using the function control section to monitor and control the parameters associated with the selected function. The bands of function select controls across the channels on the console enhance the readability of the console substantially, allowing the operator to easily determine the functions assigned to the function control section for the individual channels.

In still another embodiment of the invention, the function control section includes a plurality of sets of rotary function control devices, such as knobs. Sets in the plurality of sets of function control devices are coupled with corresponding channels, and arranged in respective columns on the control panel with the columns of function select switches for the corresponding channels. The alignment of the function control devices with the columns of function control switches, further enhances readability of the console.

In another embodiment of the invention, an audio processor having a plurality of channels and a plurality of functions in the channels is comprised of a control panel, a plurality of sets of function select controls on the control panel, a function control section on the control panel, and logic coupling the function select controls and function control section as in the embodiment described above. This embodiment is also comprised of audio processing resources coupled with the logic which process the plurality of channels in response to the plurality of sets of function select controls and the function control section.

In another embodiment of the invention, the sets of function select controls include in/out switches coupled with corresponding functions in the plurality of predetermined functions. These in/out switches are arranged within the sets in a single column parallel with the single column of select switches so that the in/out switches corresponding to a particular function in the predetermined set of functions lie visually in the band of select switches for the particular function. These in/out switches include a first state which indicates that the corresponding function is executing in the corresponding channel, and a second state indicating that the corresponding function is not executing in the corresponding channel. These in/out switches include elements having a first visually distinguishable mode indicating the first state and a second visually distinguishable mode indicating the second state by which an operator is able to determine the state of the in/out switch by looking at the in/out switch.

In still another embodiment of the invention, the in/out switches include a third state indicating that resources for executing the corresponding function in the corresponding channel are not allocated by the audio processor. In this embodiment the in/out switches comprise elements having a first visually distinguishable state indicating the first state, a second visually distinguishable state indicating the second state, and a third visually distinguishable state indicating the third state.

In still another embodiment of the invention an audio mixer having a plurality of channels and a plurality of functions in the channels is comprised of a control panel, a plurality of sets of function select controls on the control panel, a function control section on the control panel, logic coupling the function select controls and function control section, and audio processing resources coupled with the logic all as summarized above. Further, the function control section of an audio mixer comprises a plurality of sets of rotary function control devices as summarized above. Still further, the sets of function select controls of an audio mixer include in/out switches as summarized above.

Accordingly, the present invention provides a functional display for a control device of an audio mixer designed to solve significant market problems associated with the difficulty of the use of audio mixing consoles in the prior art. Particularly, the column layout of the sets of function select controls allows the operator to quickly scan his console to determine which functions are being controlled on which channels. This allows the operator to spend less time managing and watching the controls, and more time adjusting the audio signals to efficiently produce the desired final audio product.

The use of the in/out switches provides further advantages for the operator of a digital audio mixing console. First, the in/out switches enable the operator to simply scan the console to immediately identify which functions are allocated to each channel by the processing resources, which channels are being subjected to the heaviest signal processing, and which functions are actually operating on each channel. Thus, after a quick scan of his console, an operator immediately knows what functions are available to apply to a channel without toggling through, or interrogating, each function on each channel individually. This saves time and allows the operator to spend more time mixing the audio signal with the added benefit of the increased processing capability of a digital console. A further advantage of the in/out switches is that they allow the operator to toggle any function in any channel in or out of circuit with a single action. This is important in that it is a common procedure for sound engineers to toggle functions in and out while they listen to the signal on the corresponding channel to aurally analyze the effect the given function is having on the signal. Traditional analog consoles allow operators to perform this action in a single step, thus it is important that the invention enables the operator to perform this common task in a familiar manner.

In one embodiment the sets of function control devices are arranged with corresponding sets of function select switches in respective channels, such as by being laid out above, below, or interspersed among the set of function select switches. This arrangement allows the operator to quickly manipulate the function select switches to change the function being controlled in the channel and then move his hand directly up, down, left or right respectively to the function control devices to alter the parameters of the function being controlled. Thus, if an operator needs to change the parameters of a particular function in a channel, but yet does not want to continuously monitor that function, he can quickly scan the console to see if the in/out switch for that function on that channel indicates that the function is allocated to the channel. If so, he can simply push the function select switch for the desired function, manipulate the function control devices to alter the parameters, and immediately switch back to the original function in the channel. The functional layout of this embodiment thus allows the operator to take advantage of the multiple function processing capability of the digital console while maintaining the user friendly control layout of a traditional analog console.

Overall the present invention provides an improved technology for use at large scale recording and mixing installations that require premium audio fidelity and a high degree of computer automation and integration which can only be provided by digital consoles. The functional display improves the ability of the operator to use quick scans of the console, rather than interrogation, to monitor and control the state of a large number of parameters, while simultaneously maintaining the user friendly features of traditional mixing consoles.

Other aspects and advantages of the present invention can be seen upon review of the figures, the detailed description and the claims which follow.

BRIEF DESCRIPTION OF THE DRAWINGS

The figures illustrate the invention by way of example, and not limitation. Like references indicate similar elements.

DETAILED DESCRIPTION

Figure 3:
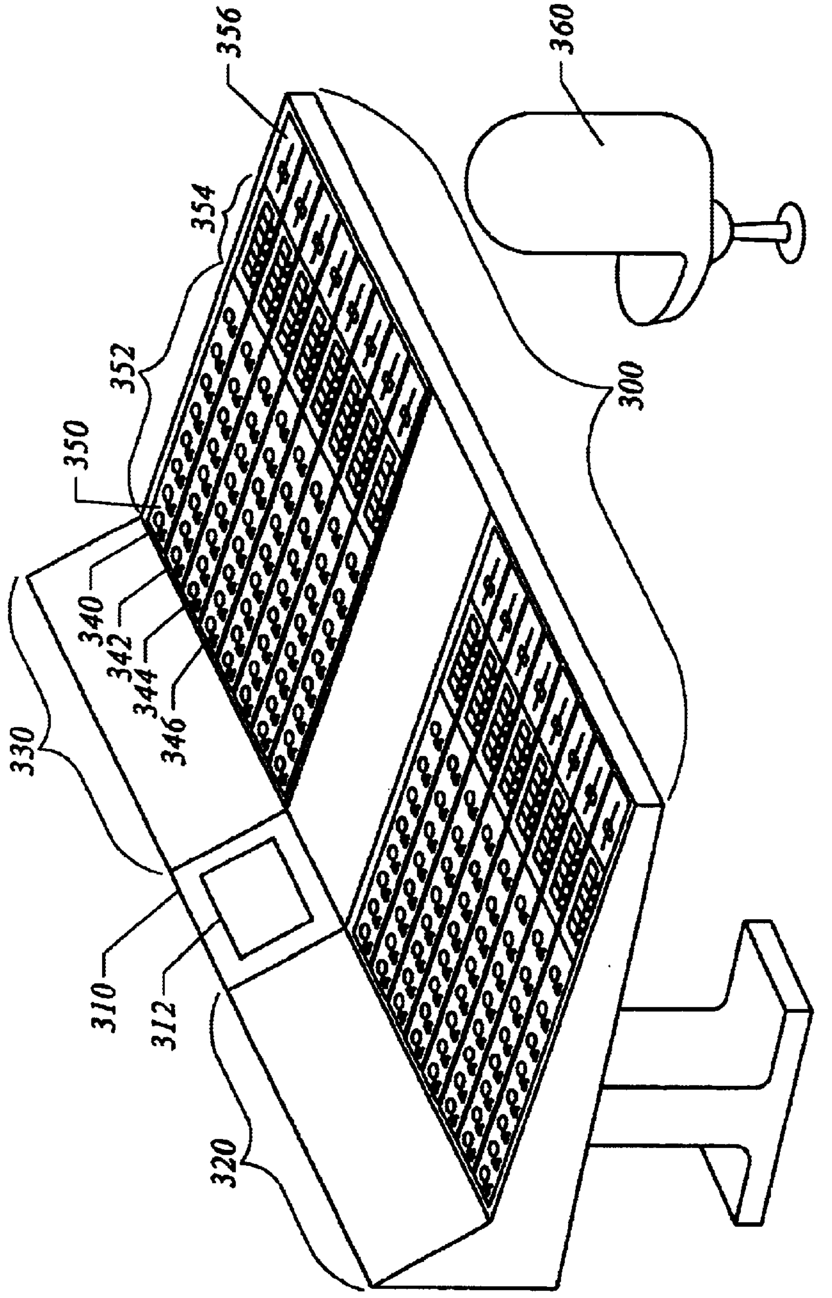
FIG. 3 illustrates a simplified perspective view of the layout of an audio mixing console with a plurality of channels utilizing one embodiment of the invention.

A detailed description of preferred embodiments is provided with respect to the figures, in which FIG. 3 provides a simplified perspective view of an audio mixer console according to one embodiment of the present invention. As can be seen in FIG. 3, the mixer console includes a control device 300. The control device includes a central region generally 310, that includes a variety of controls and buttons for overall management of the mixing console. In the central region 310, control devices for audio mixers typically include at least one CRT display 312 which provides a graphical user interface for computer control of the mixer. The control device 300 further includes a plurality of channel strips 340 on either side of the central region 310 as represented by first channel strip region 320 and second channel strip region 330. Each channel strip 340 consists of a channel control module 350 that is used to control the audio processes that are applied to the audio inputs to the channel strip 340. Each channel control module 350 includes a function control section 352, a function select control section 354, and a fader section 356. In another embodiment such as that illustrated in FIG. 7 and described later, there may be a function control section or sections that is located outside of the individual channel strip 340. In the region 330, eight channel strips 340 of controls are illustrated corresponding to the controls for eight channels on the mixer, including strips 340, 342, 344 and 346.

In an actual system, there may be dozens of channels, and correspondingly dozens of strips of controls for such channels. Thus, the ease of use and ready display of information concerning the parameters under control in the large number of channels is critical to a usable mixer console. Furthermore, the operator, who generally operates the system while sitting centrally in an operator's chair 360, develops a skill with these processors that allows the use of peripheral vision and intuitive sensing of the settings used for a particular piece of music or other audio. Thus, an organized and informative functional display, such as the one provided by the invention, is critical to peak operator performance.

Figure 4:
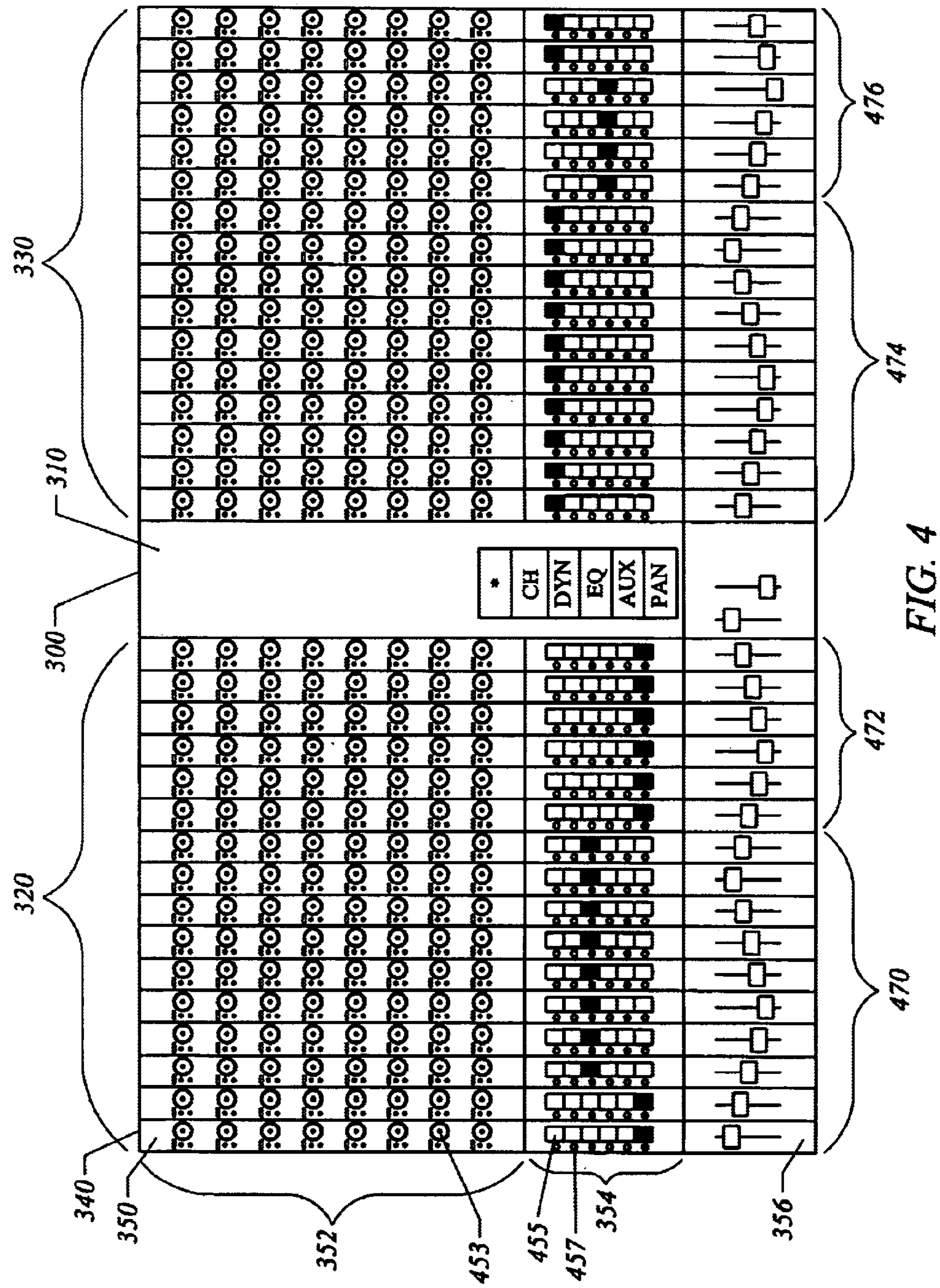
FIG. 4 illustrates a simplified top view of the layout of a portion of an audio mixing console with a plurality of channels utilizing one embodiment of the invention.

FIG. 4 provides a more detailed top view of a portion of the control device of a mixing console utilizing one embodiment of the invention. As can be seen in FIG. 4, the console includes a control device 300. The control device 300 generally includes a central region 310, that may include a variety of controls and indicators for overall management of the console. The control device 300 further includes a plurality of channel strips 340 on either side of the central operations area 310 as represented by first channel strip region 320 and second channel strip region 330. Each channel strip 340 consists of a channel control module 350 that includes a function control section 352, a function select control section 354, and a fader section 356.

Each function control section 352 includes a plurality of function control devices 453. Each function select control section 354 includes a plurality of function select switches 455. The plurality of function select switches 455 within a single function select control section 354 are arranged in a single column. Further, the function select switches 455 are arranged in the same order in the function select control section 354 of each channel control module 350. This arrangement allows an operator to quickly scan the console to determine what function is being controlled in each channel strip 340 since the function select switches 455 for a particular function form a single band on the control device 300. Each function control section 354 may also include a plurality of in/out switches 457. The in/out switches 457 are arranged in a single column parallel with the column of function select switches 455 such that the in/out switches 457 corresponding to a particular function lie visually in the band of function select switches 455 for the particular function.

Figure 5:
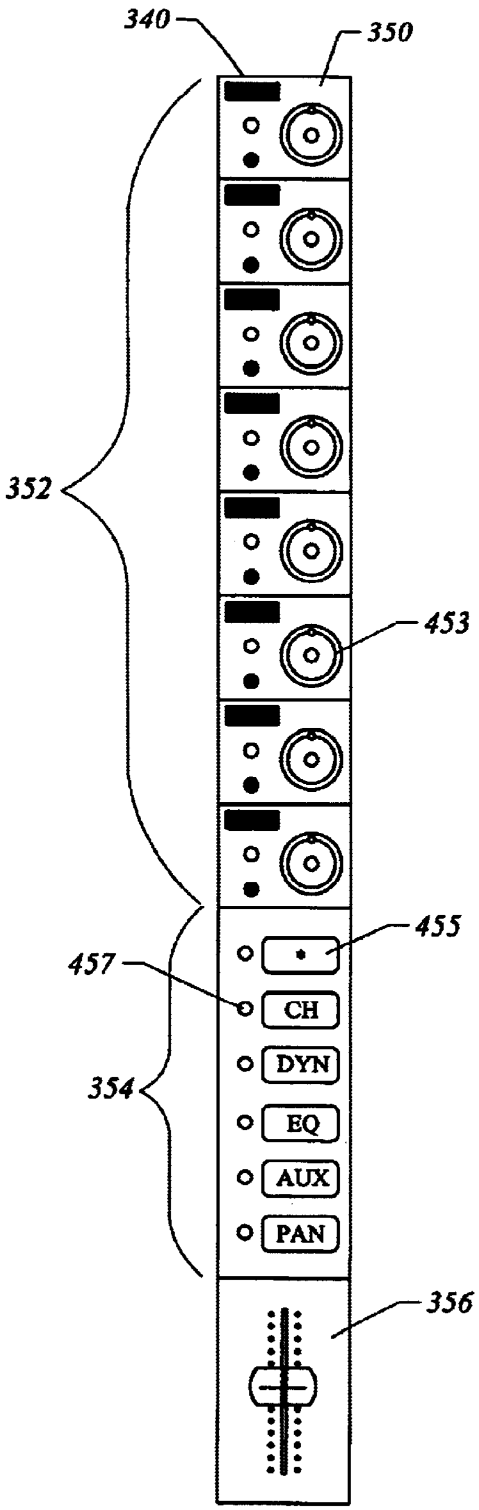
FIG. 5 illustrates a top view of a single channel of an audio mixing console utilizing one embodiment of the invention.

FIG. 5 is a more detailed top view of one of the channel strips 340, and illustrates all of the aforementioned elements. FIG. 5 also includes an illustration of some of the audio processing functions that one embodiment of the invention could include in its sets of function select switches 455. As shown these functions may include among others: Operator Programmable Function "*", Channel "Ch", Equalization "EQ", Dynamics "Dyn", Auxiliary Send "Aux", and Pan.

The operator programmable function * is a function that can be defined by the operator to be any function that the host audio processing equipment is capable of performing on the input audio signals. The Ch function is used to trim the gain of an input audio signal. The EQ function is used to adjust frequency related parameters of the input signals such as boost, cut, peaking, shelving and Q. The Dyn function can be used for automated gain control of the audio inputs. The Aux function is used to control the taking of a portion of a signal in a channel and sending it to an auxiliary processing device for further processing before the signal portion is mixed back into the final audio mix. Finally, the Pan function can be used to vary the position of the audio signal in the mix.

When an operator of the mixing console of FIG. 4 desires to control a particular function in a channel strip 340 he selects the function by operating the appropriate function select switch 455 in the channel control module 350 associated with the identified channel strip 340. Assuming that the function has been allocated by the host audio processing system, then the indicator for the operated function select switch 455 will give visual feedback to indicate to the operator that it has been selected. In one embodiment, the function select switches 455 are buttons, and the indicating mechanism is a light which illuminates the function select switch 455 when it has been selected.

After making the selection the operator can adjust the parameters associated with that function by operating the function control devices 453 in the function control section 352 of the corresponding channel control module 350. In this manner the operator can select whatever function he wishes to currently control in any given channel assuming that the function has been allocated resources. In one embodiment, the function control devices 453 are rotary control devices such as knobs which enable the operator to vary the parameters of the function by rotating the knob clockwise or counterclockwise. This type of rotary control device is described in greater detail in the patent application entitled, ROTARY CONTROL FOR AN AUDIO MIXER OR OTHER CONTROL PANEL referenced above.

For example, in a channel control module 350 with eight function control devices 453 an operator that selects EQ as the function to be controlled could simultaneously adjust eight different parameters associated with the EQ function. These parameters could include among others: high frequency gain, high frequency Q, high-mid frequency gain, high-mid frequency Q, low-mid frequency gain, low-mid frequency Q, low frequency gain, and low frequency Q.

Furthermore, the function control section 352 could include a page function which allows the operator to control a plurality of pages of parameters of a function with a single set of function control devices 453. For instance, in a channel control module 350 with eight function control devices 453 an operator that selects Aux as the function to be controlled could simultaneously adjust eight different parameters associated with the Aux function. These parameters could include among others: Aux1, Aux2, Aux3, Aux4, Aux5, Aux6, Aux7, and Aux8. If the operator were to operate the page function, the function control devices 453 would be applied to adjust another set of eight parameters associated with the Aux function such as: Aux9, Aux10, Aux11, Aux12, Aux13, Aux14, Aux15, and Aux16. The operator could control any number of pages of parameters associated with a function in this manner limited only by the capabilities of the system hardware.

As stated previously, in one embodiment of the invention the function select control sections 354 include in/out switches 457 that are coupled with corresponding functions. These in/out switches 457, which are also known as bypass switches in the art, provide indications to the operator and enable the operator to place a function in circuit or take a function out of circuit. When a function is in circuit, the processing associated with that function is applied to the audio signal in the channel. When a function is out of circuit, the function is not applied to the audio signal in the channel! As discussed above, the typical audio processing system associated with a mixing console does not have the capability of processing all of the functions on each of the channel strips 340. Thus, functions in a channel strip 340 that are not presently capable of being applied to the signal in that channel strip 340 are said to be not allocated.

In one embodiment of the invention, the in/out switches 457 have two states and a visual indicator such as a light for each of the states. In one state, the in/out switches 457 place their corresponding functions in circuit. The operator may place each in/out switch 457 into a second state which takes the corresponding function out of circuit in the chosen channel strip 340. The operator may then place the corresponding function back in circuit by operating the in/out switch 457 again. In one embodiment, the in/out switches 457 are buttons, and the indicator for each switch is a light which illuminates the button depending upon the current state of the in/out switch 457.

In another embodiment of the invention, the in/out switches 457 include a third state which is used to indicate to the operator whether the function associated with the in/out switch 457 has been allocated in the associated channel strip 340. In this embodiment, the in/out switches 457 indicate their status by providing a separate visual indication for each of their three possible states. For instance, if the function EQ was not allocated to a particular channel, the in/out switch 457 corresponding to EQ in that channel might be not illuminated. Similarly, if this same EQ function was allocated but not currently being applied to the signal in the channel, the associated in/out switch 457 might be illuminated dimly. Lastly, if this same EQ function was both allocated and being currently applied to the signal in the channel then the associated in/out switch 457 might be illuminated brightly.

Thus, an operator of a mixing console utilizing this embodiment of the invention could quickly scan his console to determine what functions are available on each of the channels. For, the in/out switch 457 associated with every function on the console that was not allocated would, in one embodiment, not be illuminated. Further, the operator could quickly scan his console to determine which of his channels are undergoing the heaviest processing by identifying the channels with the most in/out switches 457 that are illuminated brightly. Most importantly, this functional layout allows the operator to quickly take any function in any channel out of circuit to listen to the signal without that function's processing, and then return the function in circuit.

FIG. 4 also shows the indications that would be available to an operator of a mixing console using one embodiment of the invention for simplified example, for comparison to that described earlier with respect to FIG. 1. First function control group 470 represents a grouping of channels on which the operator has decided that "DYU" will be the function controlled the majority of the time. Similarly, second function control group 472 represents a "Pan" group, third function control grouping 474 represents an "i" group, and fourth function control group 476 represents an "EQ" group.

Referencing the layout of the function select switches 455 in the function select control section 354 shown in FIG. 5, when DYN is selected in a channel the fourth indicator from the top of the function select control section 354 will give visual feedback such as an energized light. Thus, for each of the aforementioned simplified groups one through four, the appropriate light will be on. These energized lights are illustrated in FIG. 4 for the groups described above.

Figure 1:
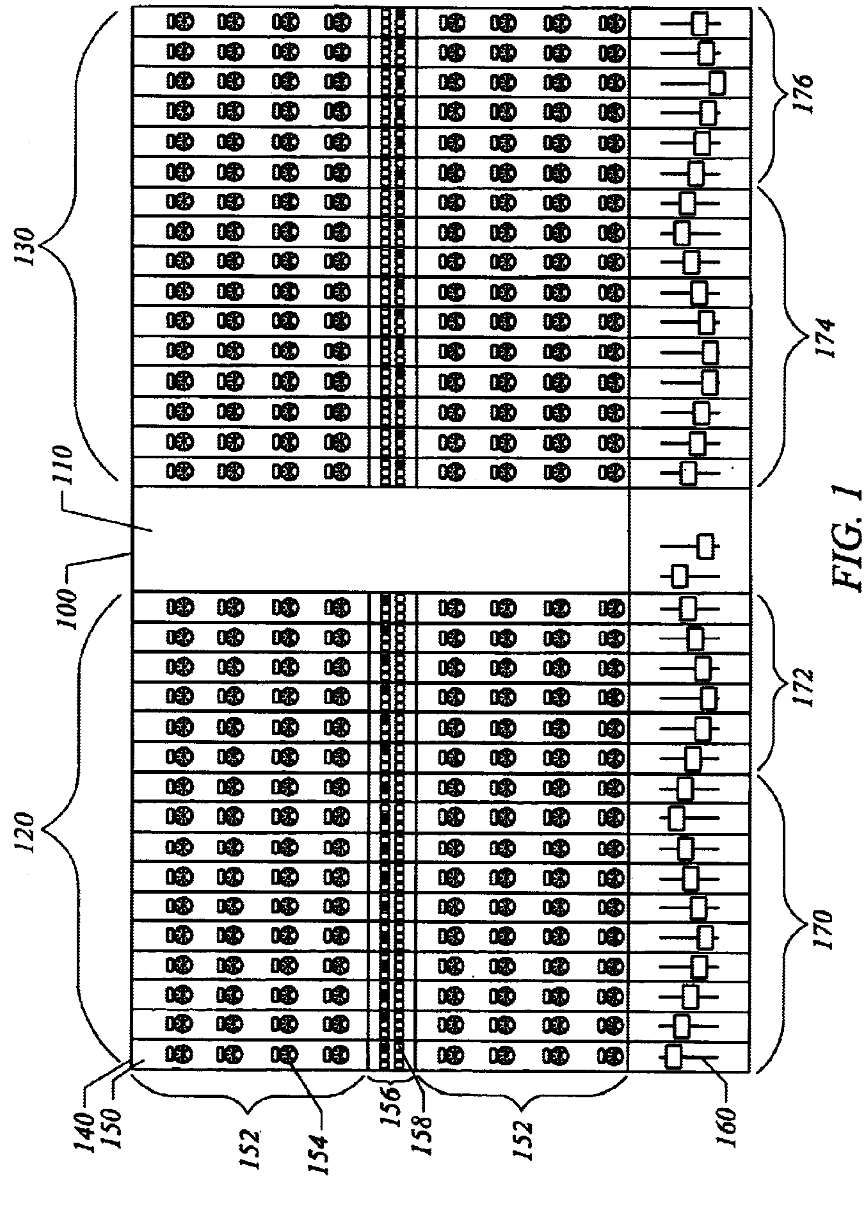
FIG. 1 (Prior Art)
FIG. 1 illustrates a simplified top view of the layout of a portion of a prior art digital audio mixing console with a plurality of channels.
Figure 2:
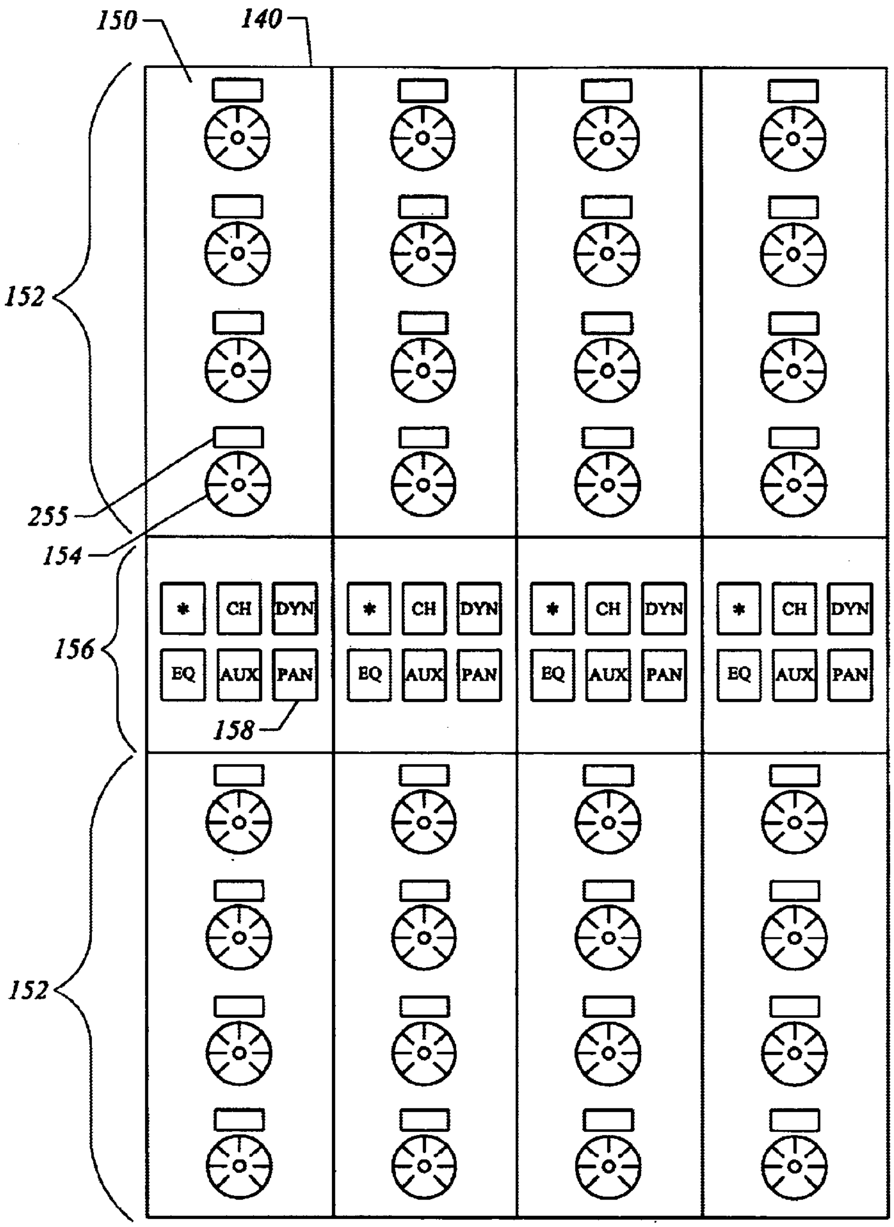
FIG. 2 (Prior Art)
FIG. 2 illustrates a simplified top view of the function controls of four channels of a typical prior art digital audio mixing console.

In comparing FIG. 4 to FIG. 1 one of the advantages of the present invention becomes clear. Note that in the first and second channels Pan is lit instead of EQ, and in the last and next to last channels * is lit instead of Dyn. This is to illustrate the indicators that will be visible to an operator when he is currently using a function other than the group function in a channel within the group. As discussed earlier, the prior art cluster design does not allow the operator to scan his console to immediately determine the status of his channels. FIG. 4 shows that the banding created by the functional layout of the function control section 354 allows an operator to make full use of his perceptual capabilities of pattern recognition and peripheral vision. An operator that glanced to his left to note the status of his channel strips 340 in region 320 could easily recognize that the first two channels were not applying the EQ function. Similarly, an operator that glanced to his right to note the status of his channel strips 340 in region 330 could easily recognize that the last two channels were not applying the Dyn function. Further, this information could be gained without the operator having to leave his operator's chair 360 to interrogate the channels.

Figure 6:
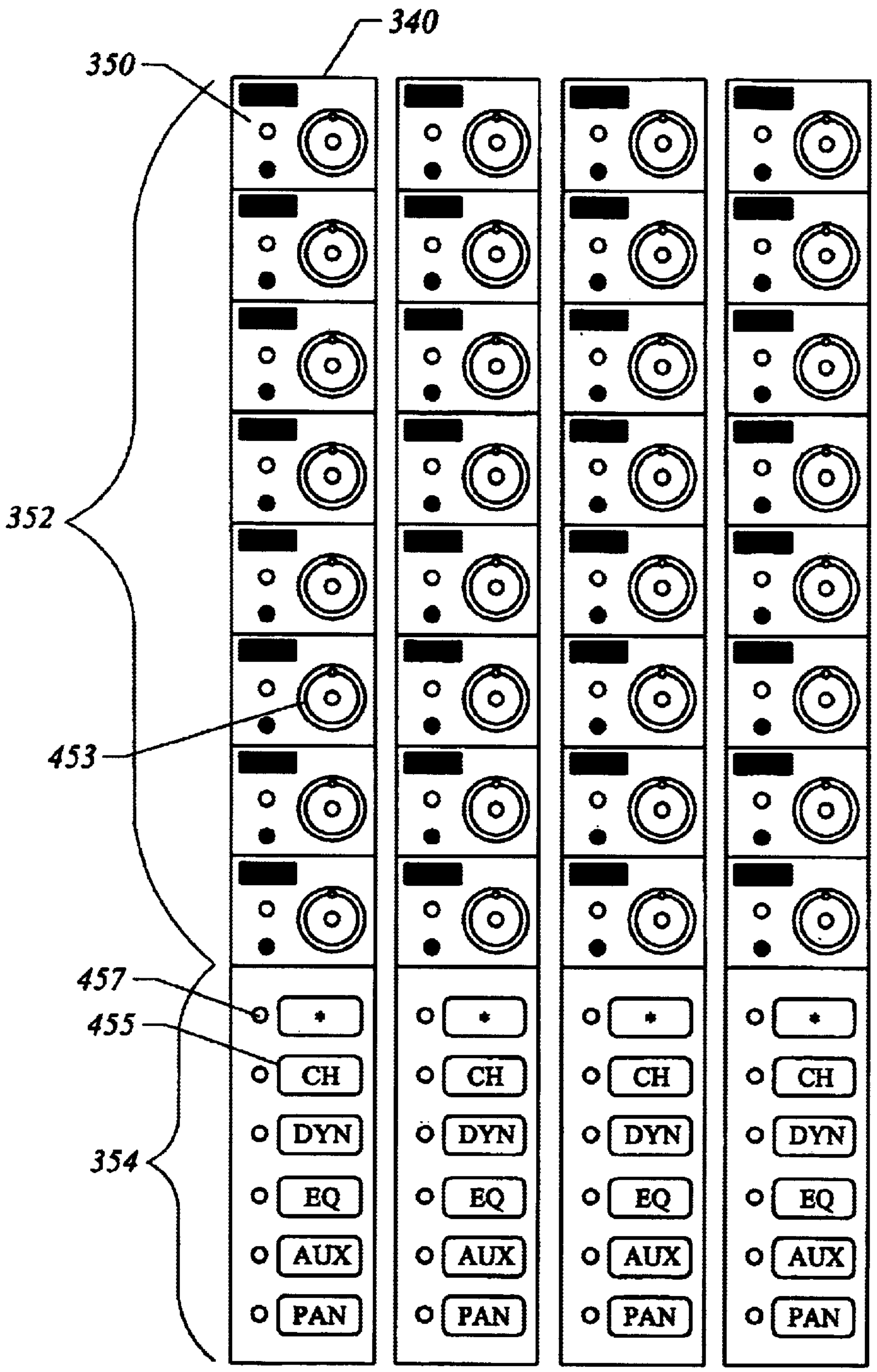
FIG. 6 illustrates a top view of four channels of an audio mixing console utilizing one embodiment of the invention.

FIG. 6 illustrates a top view of four channels of an audio mixing console utilizing one embodiment of the invention that incorporates channel assignable function control devices 453. In this embodiment of the invention, each channel strip 340 of the console has its own corresponding function control section 352. In this manner, the functions in each channel have their own dedicated set of function control devices 453. The advantage to this design is that it allows the operator not only to see what functions are currently being controlled in each channel, but also to see the relative values of the parameters associated with that function. In FIG. 6, the function control devices 453 in each function control section 352 are aligned in a single column located directly above their corresponding function select control section 354. In another embodiment, the function control section 352 could consist of a single column of function control devices 453 located below or interspersed with their corresponding function select control section 354.

Figure 7:
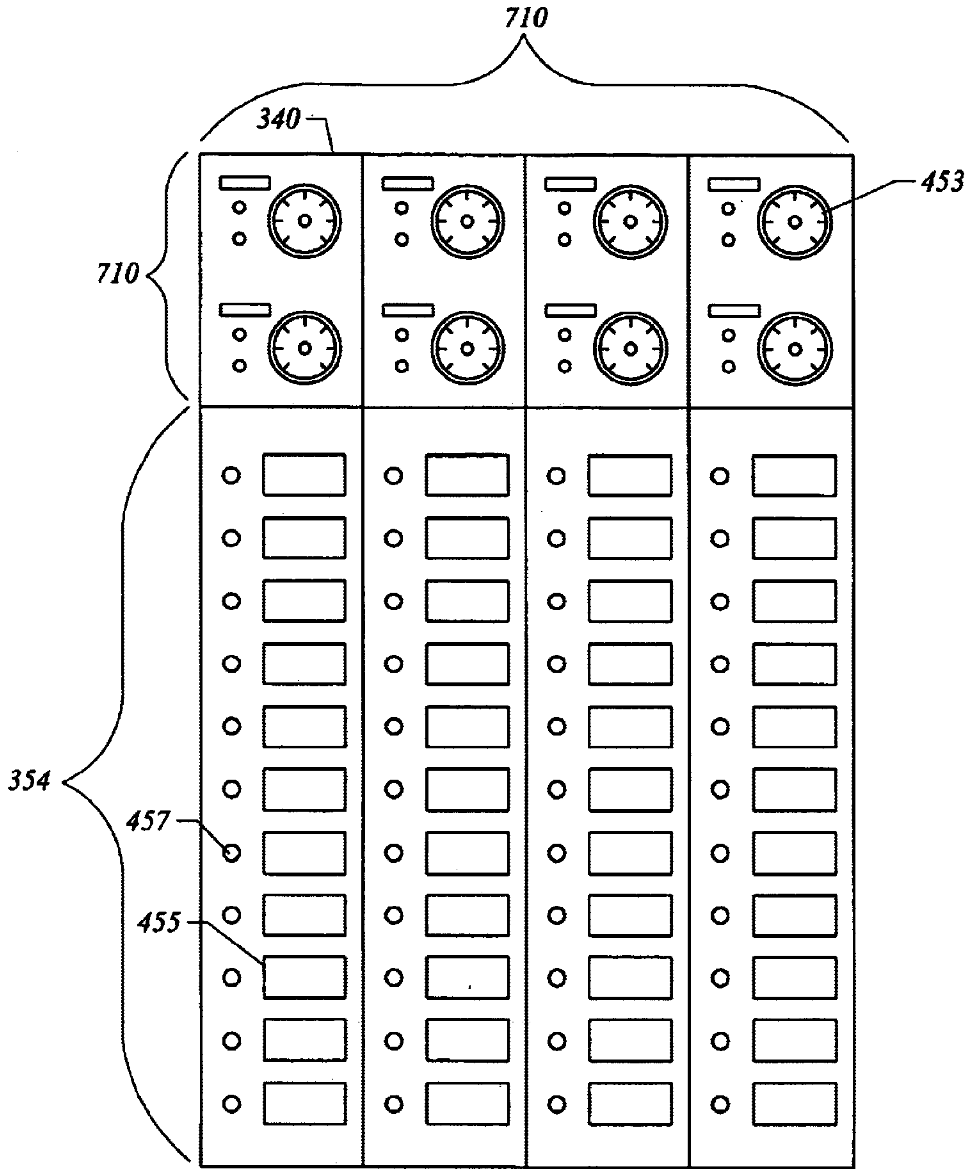
FIG. 7 illustrates a top view of four channels of an audio mixing console utilizing another embodiment of the invention.

FIG. 7 illustrates one example of an alternative embodiment of the invention. In this embodiment, there is not a function control section 352 dedicated to each channel strip 340. Instead there are several assignable sets of function control devices 710 that are utilized to control the parameters of the functions selected in the channels. For instance, as illustrated in FIG. 7, there may be one set of assignable function control devices 710 assigned to four channels 340. In this case, prior to adjusting the parameters of a function in one of the channel strips 340 assigned to the set of assignable function control devices 710, the operator would have to assign the desired channel strip 340 to the function control devices 710, and then adjust the function control devices 453 to vary the desired parameters. This embodiment may be realized by using as few as one set of assignable function control devices 710. One advantage to a single set of function control devices 710 is that they could be located in the central region 310 of the console directly in front of the operator. This would allow the operator to control all of the functions in all of the channels 340 without leaving his operator's chair 360. Another advantage is illustrated in FIG. 7 in that by using assignable function control devices 710, more room is left on the console in which more function select switches 455, and in/out switches 457 could be added to increase the amount of control and information that is provided to the operator. In another alternative, more than one channel is assigned to each strip 340, allowing control of many channels in a compact console.

Figure 8:
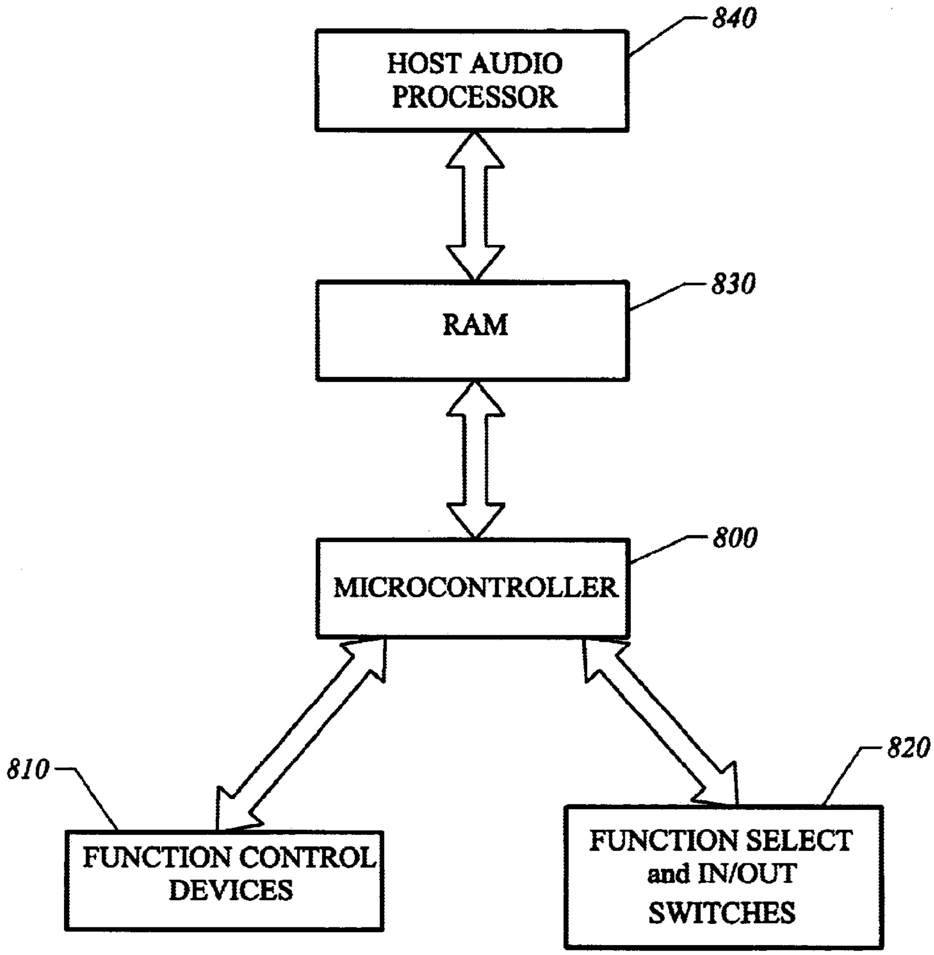
FIG. 8 illustrates a simplified block diagram of the control logic for the function select controls and function control devices according to the present invention.

FIG. 8 illustrates a simplified block diagram of the control logic for the function select controls and function control devices according to the present invention. FIG. 8 provides a simplified diagram of the control logic utilized for managing the function control devices 453, function select switches 455, and in/out switches 457 in the channel strips 340 of the present invention. Thus, referring also to FIG. 4, in one example embodiment each channel strip 340 on the control device 300 includes a microcontroller 800. The microcontroller 800 is coupled to the function control devices 810 associated with the channel strip 340 and to the function select and in/out switches 820 associated with the channel strip 340. The microcontroller 800 is also coupled to a memory 830 implemented with a dual port random access memory. Also, the host processor 840 of the audio processor is able to access the dual port RAM 830. The microcontroller 800 scans the function control devices 810 and function select and in/out switches 820 in the channel strip 340 and updates the data structures in the RAM 830 as appropriate. The host processor 840 similarly scans the RAM 830, and responds to operator or computer manipulation of the function select and in/out switches 820 and/or the function control devices 810. For instance, if an operator were to press the EQ function select switch 455 in channel strip 340, the microcontroller 800 would detect this manipulation and then update the data structure of the RAM 830. The host audio processor 840 would detect this change in the data structure of the RAM 830 and respond by altering the routing of control signals in the audio processor such that any future adjustment of the function control devices 453 would alter the parameters of the EQ function operating on the signal in that channel.

Similarly, assuming the EQ function was allocated to channel 340 and EQ was not currently being applied to the signal in the channel 340, if the operator or computer were to select "in" on the EQ in/out switch 457, then the microprocessor 800 would detect this change and cause an update to the data structure of the RAM 830. The host audio processor 840 would detect this change in the data structure of the RAM 830 and respond by altering the routing of the audio signal through the channel, 340 such that it was routed through the EQ function.

Although illustrative embodiments of the invention have been described in detail herein with reference to the accompanying drawings, it is to be understood that the invention is not limited to those precise embodiments. As such, many modifications and variations will be apparent to practitioners skilled in this art. Accordingly, it is intended that the scope of the invention be defined by the following claims and their equivalents.

What is claimed is:

1. A control device for an audio processor having a plurality of channels and a plurality of functions in the channels, comprising:

a control panel;

a plurality of sets of function select controls on the control panel, the sets coupled with corresponding channels in the plurality of channels, the sets including select switches for a predetermined set of functions executable in the corresponding channels, the select switches having first and second states, and comprising elements first and second visually distinguishable modes by which an operator is able to determine the state of the select switch by looking at the select switch;

a function control section on the control panel, including controls for setting parameters for a selected function in a selected channel; and logic coupled with the plurality of sets of function select controls and the function control section which, in response to the state of the select switch for a selected function in the set of function select controls corresponding to a selected channel, enables the audio processor to apply the selected function to the controls in the function control section to enable at least one of monitoring and control of the parameters associated with the selected function for the selected channel by the operator using the function control section;

wherein the plurality of sets of function select controls are arranged on the control panel in a row, and the select switches in the plurality of sets are arranged in respective single columns within the plurality of sets so that the select switches for a particular function in the predetermined set of functions across the plurality of channels form a single band on the control panel to enable the operator to identify the states of select switches for a particular function in the plurality of functions by looking along a band of select switches on the control panel; and wherein the function select controls include in/out switches coupled with corresponding functions in the plurality of predetermined functions, the in/out switches including a first state enabling the audio processor to execute the corresponding function in the corresponding channel, and a second state not enabling the audio processor to execute the corresponding function in the corresponding channel; and wherein the in/out switches include a third state indicating that resources for executing the corresponding function in the corresponding channel are not allocated by the audio processor.

2. The control device of claim 1, wherein the in/out switches comprise elements having a first visually distinguishable state indicating the first state, a second visually distinguishable state indicating the second state, and a third visually distinguishable state indicating the third state.

3. The control device of claim 2, wherein the in/out switches are arranged within the sets in a single column parallel with the single column of select switches so that in/out switches corresponding to a particular function in the predetermined set of functions lie visually in the hand of select switches for the particular function.

4. An audio processor having a plurality of channels and a plurality of functions in the channels, comprising:

a control panel;

a plurality of sets of function select controls on the control panel, the sets coupled with corresponding channels in the plurality of channels, the sets including select switches for a predetermined set of functions executable in the corresponding channels, the select switches having first and second states, and comprising elements having first and second visually distinguishable modes by which an operator is able to determine the state of the select switch by looking at the select switch;

a function control section on the control panel, including controls for setting parameters for a selected function in a selected channel; and logic coupled with the plurality of sets or function select controls and the function control section which, in response to the state of the select switch for a selected function in the set of function select controls corresponding to a selected channel, enables the audio processor to apply the selected function to the controls in the function control section to enable at least one of monitoring and control of the parameters associated with the selected function for the selected channel by the operator using the function control section;

wherein the plurality of sets of function select controls are arranged on the control panel in a row, select switches in the plurality of sets are arranged in respective single columns within the plurality of sets so that the select switches for a particular function in the predetermined set of functions across the plurality of channels form a single band on the control panel to enable the operator to identify the states of select switches for a particular function in the plurality of functions by looking along a band of select switches on the control panel; and audio processing resources coupled with the logic which process the plurality of channels in response to the plurality of sets of function select controls and the function control section;

wherein the function select controls include in/out switches coupled with corresponding functions in the plurality of predetermined functions, the in/out switches including a first state enabling the audio processor to execute the corresponding function in the corresponding channel, and a second state not enabling the audio processor to execute the corresponding function in the corresponding channel; and wherein the in/out switches include a third state indicating that resources for executing the corresponding function in the corresponding channel are not allocated by the audio processing resources.

5. The audio processor of claim 4, wherein the in/out switches comprise elements having a first visually distinguishable state indicating the first state, a second visually distinguishable state indicating the second state, and a third visually distinguishable state indicating the third state.

6. The audio processor of claim 5, wherein the in/out switches are arranged within the sets in a single column parallel with the single column of select switches so that in/out switches corresponding to a particular function in the predetermined set of functions lie visually in the third state.

7. An audio mixer having a plurality of channels and a plurality of functions in the channels, comprising:

a control panel;

a plurality of sets of function select controls on the control panel for a predetermined set of functions executable in the corresponding channels, the sets coupled with corresponding channels in the plurality of channels, the sets including select switches for the predetermined set of functions, the select switches having first and second states, anti comprising elements having first and second visually distinguishable modes by which an operator is able to determine the state of the select switch by looking at the select switch, and in/out switches coupled with corresponding functions in the plurality of predetermined functions, the in/out switches including a first state indicating that the corresponding function is executing in the corresponding channel, and a second state indicating that the corresponding function is not executing in the corresponding channel, and including elements having a first visually distinguishable mode indicating the first state and a second visually distinguishable mode indicating the second state by which an operator is able to determine the state of the in/out switch by looking at the in/out switch;

a function control section on the control panel, including controls for setting parameters for a selected function in a selected channel, the function control section including a plurality of sets of rotary function control devices, sets in the plurality of sets of function control devices coupled with corresponding channels, and arranged in respective columns on the control panel with the columns of function select switches for the corresponding channels;

logic coupled with the plurality of sets of function select controls and the function control section which, in response to the state of the select switch and of the in/out switch for a selected function in the set of function select controls corresponding to a selected channel, enables the audio processor to apply the selected function in the selected channel to the controls in the function control section to enable at least one of monitoring and control of the parameters associated with the selected function for the selected channel by the operator using the function control section;

wherein the plurality of sets of function select controls are arranged on the control panel in a row, and the select switches in the plurality of sets are arranged in respective single columns within the plurality of sets so that the select switches for a particular function in the predetermined set of functions across the plurality of channels form a single band on the control panel, and the in/out switches are arranged within the sets in a single column parallel with the single column of select switches so that in/out switches corresponding to a particular function in the predetermined set or functions lie visually in the single band of select switches for the particular function, to enable the operator to identify the states of select switches and the in/out switches for a particular function in the plurality of functions by looking along a band on the control panel;

audio processing resources coupled with the logic which process the plurality of channels in response to the plurality of sets of function select controls and the function control section;

wherein the in/out switches include a third state indicating that resources for executing the corresponding function in the corresponding channel are not allocated by the audio processing resources.

8. The audio mixer of claim 7, wherein the predetermined set of functions includes an equalizer function, a dynamics function, an auxiliary send function and a pan function.

9. The audio mixer of claim 8, wherein the predetermined set of functions includes an operator programmable function.

10. The audio mixer of claim 7, wherein the elements of the select switches having first and second visually distinguishable modes comprise lights.

11. The audio mixer of claim 7, wherein the select switches comprise buttons, and the elements of the selects switches having first and second visually distinguishable modes comprise lights in the buttons.

12. The audio mixer of claim 7, wherein the in/out switches comprise elements having a third visually distinguishable state indicating the third state.

* * * * *